United States Patent
Kalkunte et al.

(10) Patent No.: US 9,032,252 B2
(45) Date of Patent: May 12, 2015

(54) DEBUG BARRIER TRANSACTIONS

(75) Inventors: Sheshadri Kalkunte, Bangalore (IN); Michael John Williams, Cambridge (GB)

(73) Assignee: ARM Limited, Cambridge (GB)

( * ) Notice: Subject to any disclaimer, the term of this patent is extended or adjusted under 35 U.S.C. 154(b) by 87 days.

(21) Appl. No.: 13/565,098

(22) Filed: Aug. 2, 2012

(65) Prior Publication Data

US 2013/0042142 A1 Feb. 14, 2013

(30) Foreign Application Priority Data

Aug. 3, 2011 (IN) .............................. 2194/DEL/2011
Nov. 16, 2011 (GB) .................................. 1119732.4

(51) Int. Cl.
*G06F 11/00* (2006.01)
*G01R 31/317* (2006.01)

(52) U.S. Cl.
CPC ................................ *G01R 31/31705* (2013.01)

(58) Field of Classification Search
USPC ....................................................... 714/27, 25
See application file for complete search history.

(56) References Cited

U.S. PATENT DOCUMENTS

2010/0268990 A1* 10/2010 Xu et al. .......................... 714/27

OTHER PUBLICATIONS

Search Report for GB1119732.4, dated Mar. 1, 2012.

* cited by examiner

*Primary Examiner* — Sarai Butler
(74) *Attorney, Agent, or Firm* — Nixon & Vanderhye P.C.

(57) ABSTRACT

An integrated circuit 2 includes one or more transaction masters 8, 10, 12, 4 for issuing data transactions via interconnect circuitry 20. Debug access port circuitry is configured to respond to debug commands received from a debug controller 6 to generate barrier transactions which are issued to the interconnect circuitry. The interconnect circuitry responds to the received barrier transactions by constraining a relative ordering of at least some of the data transactions as they pass through the interconnect circuitry.

21 Claims, 5 Drawing Sheets

DEBUG BARRIER TRANSACTIONS

This application claims priority to IN Application No. 2194/DEL/2011 filed Aug. 3, 2011 and GB Application No. 1119732.4 filed Nov. 16, 2011, the entire contents of each of which are incorporated herein by reference.

BACKGROUND OF THE INVENTION

1. Field of the Invention

This invention relates to the field of integrated circuits. More particularly, this invention relates to techniques for debugging integrated circuits.

2. Description of the Prior Art

It is known to provide integrated circuits with debug mechanisms. Some known debug mechanisms provide the ability to generate memory transactions to read or write memory locations within the memory address space of an integrated circuit. These debug mechanisms can accordingly act as a transaction master and can be useful in reading data to determine the state of the integrated circuit and writing data to provide a desired stimulus to the integrated circuit.

It is typically the case that the number of connection pins provided to an integrated circuit to support debug operations is low. The rate of increase in pins on integrated circuit packages has not kept apace with the rate of increase in complexity of those circuits (the so-called Moore's Law). There is considerable pressure to use connection pins to an integrated circuit for other functions. The debug operations may only be used during development and accordingly it is difficult to justify dedicating many connection pins to debug functions. This has the consequence of restricting the bandwidth with which a debug controller may communicate with debug circuitry upon an integrated circuit to instruct transactions such as memory reads and memory writes to be performed. A typical integrated circuit may be operating at a frequency of the order of gigahertz whereas a debug interface may only be able to communicate at a frequency of a few megahertz. This mismatch in speed limits the way in which debug initiated transactions may be combined with other transactions which are occurring at full speed within the integrated circuit.

In order to increase the usefulness of the debug mechanisms provided for integrated circuits, it is desirable to increase the rate at which debug operations can be performed while not increasing, or preferably reducing, the number of pins dedicated to debug. One way to achieve this is to increase the bandwidth with which the debug controller may communicate via the debug interface with the integrated circuit. Advances in serial data communication technology, such as advances in USB-type communication, have the result that it is becoming possible to communicate with the debug mechanisms upon an integrated circuit on timescales more comparable with the timescales upon which the integrated circuit internally performs its data processing operations, without increasing the debug pin count.

A further option is to enhance the debug circuitry within the integrated circuit. More complex debug circuitry enabled by increasing levels of integration mean that comparatively simple commands sent by the debug controller over the debug interface can be converted into complex transactions, e.g. repetitive actions such as block memory fill. Operations can also be buffered by the debug circuitry, so that the debugger does not need to poll the debug interface and wait for one operation to complete before sending further operations. Both options can be combined.

SUMMARY OF THE INVENTION

Viewed from one aspect the present invention provides an integrated circuit comprising:

one or more transaction masters configured to generate a plurality of data transactions;

debug access port circuitry configured to be coupled via a debug interface to a debug controller external of said integrated circuit; and interconnect circuitry coupled to said one or more transaction masters and said debug access port circuitry and configured to receive a plurality of data transactions from said one or more transaction masters and said debug access port circuitry, wherein said debug access port circuitry is configured to respond to one or more debug commands received from said debug controller via said debug interface to generate a barrier transaction; and said interconnect circuitry is configured to receive said barrier transaction and to respond to said barrier transaction by constraining a relative ordering between a first subset and said second subset of said plurality of data transactions at least through said interconnect circuitry.

The present techniques recognise that when high speed debug access and increased debug circuit complexity are provided to an integrated circuit, more sophisticated types of interaction with that integrated circuit become possible during debug. Furthermore, the ordering and synchronisation of debug activity relative to data transactions initiated by the one or more transaction masters on the integrated circuit becomes more significant, particularly when the debug circuitry can buffer many complex debug operations and execute them at system speed. The present technique provides the debug access port circuitry on the integrated circuitry with the ability to respond to debug commands received from outside the integrated circuitry to generate barrier transactions. These barrier transactions are used to constrain the relative ordering of at least some of the data transactions passing through the interconnect circuitry of the integrated circuit in a manner which permits more sophisticated and accurate debug operations to be performed. Another way of considering the action of barrier transactions is that they split the other transactions into two groups, A and B (and a third group transaction of transactions not ordered by the barrier) and create order between those groups. These groups (subsets) are non-overlapping.

There are different types of barrier transaction which it is possible to introduce (inject) using the present techniques. In some embodiments the barrier transaction is a memory barrier transaction and the interconnect circuitry is configured to provide that at least some actions of all of said transactions of said first subset are observable to each observer, being one of said one or more transaction masters and said debug access port circuitry, before actions of any of said transactions of said second subset are observable to said observer. Observable has the effect that should an observer make an observation (e.g. a read) then they would note (see) the action, but does not require the observer to actually make that observation. An example implementation may maintain the relative ordering by not permitting reordering of at least some of the data transactions across the memory barrier transactions. Thus, the data transactions on each side of the barrier transaction may be reordered providing they stay upon the same side of the barrier transaction, but no data transaction may be reordered such that it changes from one side of the barrier transaction to the other side of the barrier transaction.

In other embodiments, either separately or in combination with the memory barrier transaction, there may be provided a synchronisation barrier transaction. The interconnect circuitry in this case is configured to provide that at least some actions of all of said transactions of said first subset are observable to all observers, being said one or more transaction masters and said debug access port circuitry, before actions of any of said transactions of said second subset are observable to any of said observers. An example implementation may maintain the relative ordering by delaying a second subset of transactions succeeding the synchronisation barrier transaction until a first subset of transactions immediately preceding the synchronisation barrier transaction have reached their destination slaves.

In a system with multiple transaction masters, this relative ordering must be maintained such that all masters see the same ordering, even if they are not the master issuing the transaction. For example, if one master issues a pair of write transactions with an intervening barrier transaction, then another master reading those locations must only be able to observe written values in the order guaranteed by the barrier.

There are a variety of ways in which the debug access port circuitry may be controlled by the debug controller. In some embodiments the debug access port circuitry includes a barrier control register and the debug access port circuitry is configured to respond to a barrier debug command received from the debug controller to write a barrier control value into the barrier control register. In this way, data and commands may be transferred via the barrier control register to the debug access port circuitry.

In some embodiments the debug access port circuitry may be controlled to respond to the writing of the barrier control value by generating the barrier transaction. The barrier control value may specify what type of barrier transaction is to be generated. Further information, such other parameters associated with the barrier transaction, may also be written in the barrier control register or other registers within the debug access port circuitry. The other parameters may take various forms.

Other parameters may include a domain specifier. A domain comprises a set of masters for whom the barrier guarantees observability ordering as described above.

A system may include multiple domains, and those domains may be hierarchical. For example, one group of masters may form an inner domain, whereas other masters are part of an outer domain, which also includes the inner domain.

A barrier with an inner domain parameter only guarantees observability ordering for masters in the same inner domain, whereas a barrier with outer domain ordering guarantees observability for all masters in both the inner and outer domains.

In some embodiments, the domain is specified in the barrier control value; in others, the barrier control register and the like.

Barrier signalling may, for example, use the following:
00 Non-shareable. Order for this master only.
01 Inner domain.
10 Outer domain.
11 System. All masters in system.

Viewed from another aspect the present invention provides an integrated circuit comprising:
one or more transaction master means for generating a plurality of data transactions;
debug access port means for coupling via a debug interface to a debug controller external of said integrated circuit; and
interconnect means for receiving a plurality of data transactions from said one or more transaction master means and said debug access port means, wherein said debug access port means responds to one or more debug commands received from said debug controller via said debug interface to generate a barrier transaction; and said interconnect means receives said barrier transaction and responds to said barrier transaction by constraining a relative ordering between a first subset and a second subset of said plurality of data transactions at least through said interconnect circuitry.

Viewed from a further aspect the present invention provides a method of operating an integrated circuit comprising the steps of:
generating a plurality of data transactions with one of more transaction masters;
coupling debug access port circuitry via a debug interface to a debug controller external of said integrated circuit;
receiving at interconnect circuitry a plurality of data transactions from said one or more transaction masters and said debug access port circuitry,
responding to one or more debug commands received from said debug controller via said debug interface to generate a barrier transaction issued from said debug access port circuitry to said interconnect circuitry; and
constraining, in response to said barrier transaction received by said interconnect circuitry, a relative ordering between a first subset and a second subset of said plurality of data transactions at least through said interconnect circuitry.

The above, and other objects, features and advantages of this invention will be apparent from the following detailed description of illustrative embodiments which is to be read in connection with the accompanying drawings.

DESCRIPTION OF THE EMBODIMENTS

Figure 1:
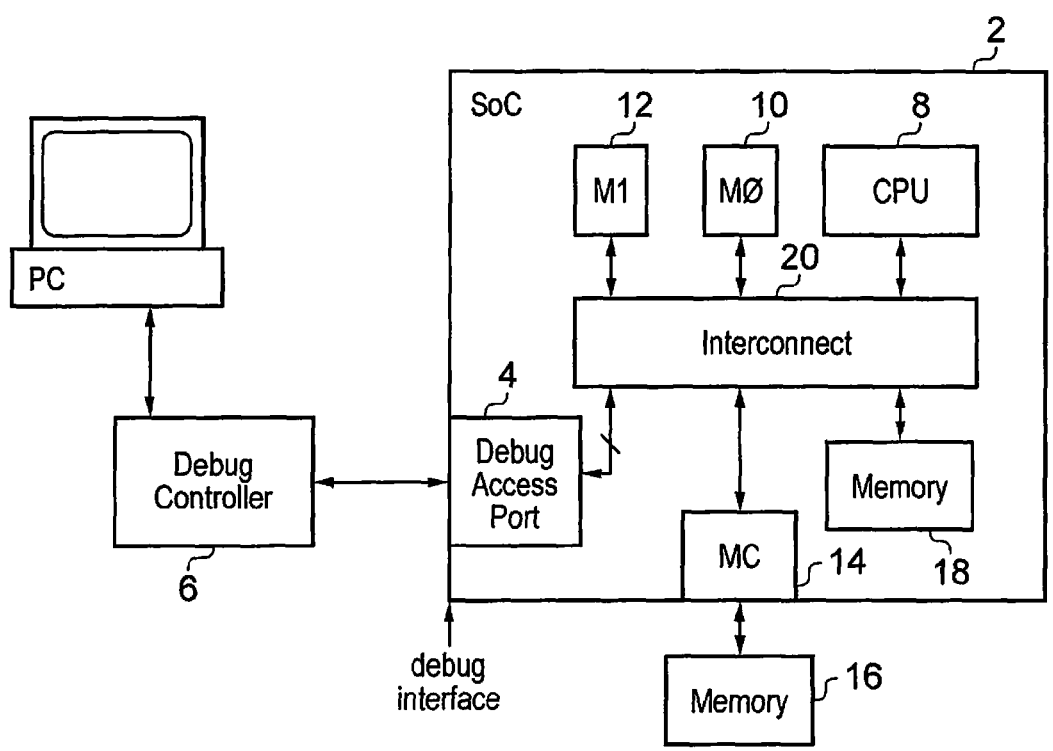
FIG. 1 schematically illustrates an integrated circuit connected via a debug interface to a debug controller.

FIG. 1 schematically illustrates an integrated circuit 2 including debug access port circuitry 4 connected via a debug interface to a debug controller 6. The integrated circuit 2 includes a plurality of transaction masters including a central processing unit 8, a first transaction master 10 and a second transaction master 12. A memory controller 14 is a transaction slave and provides access to an off-chip memory 16. There is also provided on-chip memory 18 which serves as a transaction slave. There may be other on-chip slaves, such as embedded peripherals or controllers for interfaces such as PCIe (not illustrated). The central processing unit 8, the first transaction master 10, the second transaction master 12, the debug access port circuitry 4, the memory controller 14 and the on-chip memory 18 are all connected to interconnect circuitry 20 which serves to route data transactions between masters and slaves. The interconnect circuitry 20 may, for example, support the AMBA AXI communication mechanisms and techniques designed by ARM Limited of Cambridge, England.

In operation the transaction masters 8, 10, 12 that perform normal functional mode processing generate data transactions which are routed via the interconnect circuitry 20 to the transaction slaves 14, 18. These data transactions may be write transactions or read transactions.

The debug access port circuitry 4 communicates via the debug interface with the debug controller 6. The debug controller 6 may, in turn, be controlled by a general purpose computer. The debug controller 6 serves to issue debug commands via the debug interface to the debug access port circuitry 4. These commands may include commands which trigger the debug access port circuitry 4 to generate a barrier transaction which is issued to the interconnect circuitry 20. The debug commands may also trigger read transactions or write transactions to be issued by the debug access port circuitry 4. Read transactions may be issued by the debug access port circuitry 4 to recover data values from within the system illustrated in FIG. 1. Write transactions may be issued to stimulate the system illustrated in FIG. 1 in particular ways, e.g. setting a control register within the integrated circuit to a different value to change the configuration of the integrated circuit 2.

Figure 2:
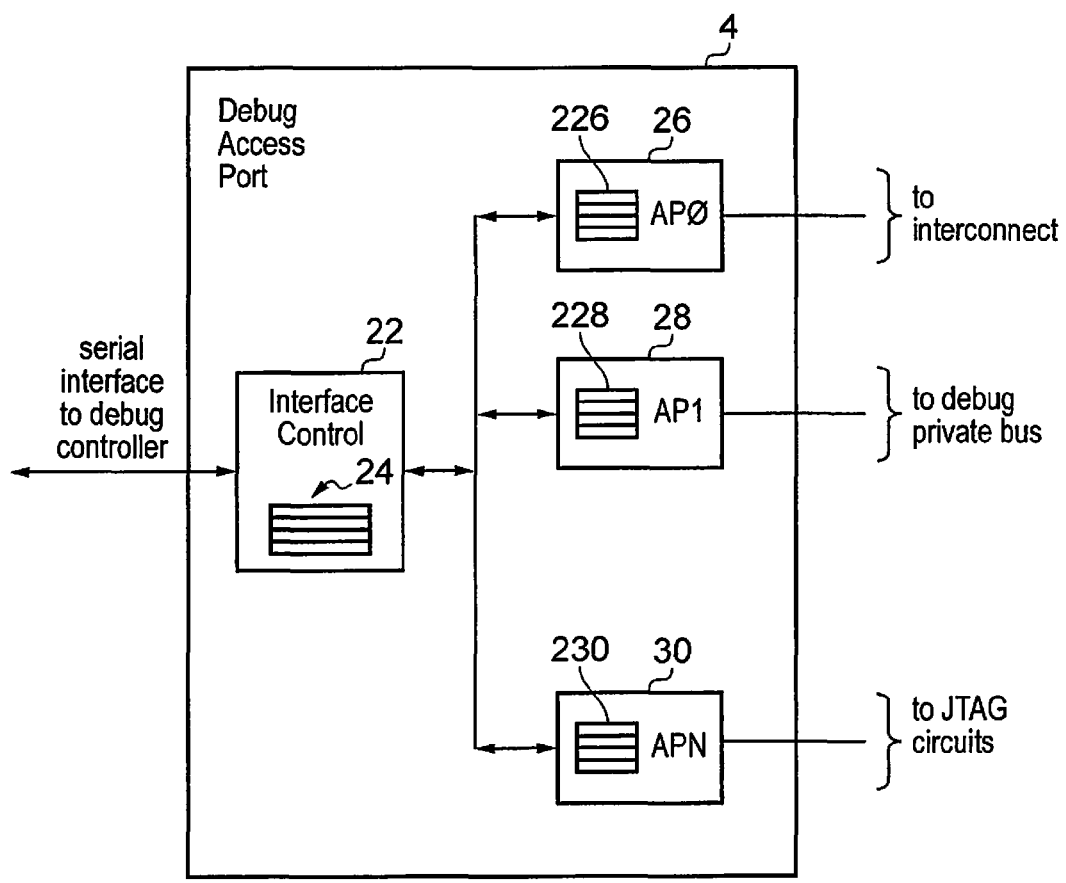
FIG. 2 schematically illustrates debug access port circuitry.

FIG. 2 schematically illustrates the debug access port circuitry 4 in more detail. The debug access port circuitry 4 includes interface control circuitry 22 which receives debug commands from the debug controller 6 via a serial interface (other forms of interface are possible) which serves as the debug interface. These debug commands serve to perform read and writes to control registers 24 within the interface control circuitry 22. Values written to these control registers 24 may be used to configure a plurality of access port nodes 26, 28, 30 within the debug access port circuitry 4 to perform a variety of debug related operations. Each of these access port nodes 26, 28, 30 itself contains access port control registers 226, 228, 230 which are programmed to configure its operation via the interface control circuitry 22 and the control registers 24. The access port nodes 26, 28, 30 include a node 26 which connects to the interconnect circuitry 20 and serves to generate write transactions, read transactions and barrier transactions issued to the interconnect circuitry 20 as configured by interface control circuitry 22, the control registers 24 and the access port control registers 226. Node 28 provides an interface to a private debug bus via which debug operations may be performed and node 30 provides an interface to JTAG serial scan chain circuits which are provided within the integrated circuit 2.

Figure 3:
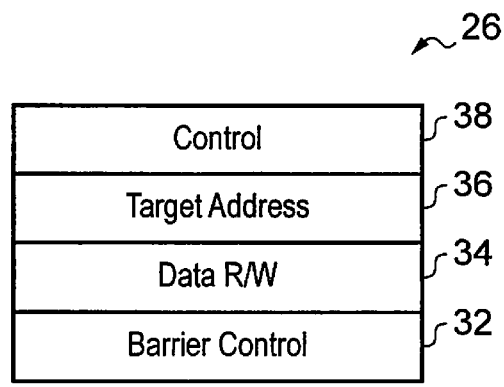
FIG. 3 schematically illustrates control registers within the debug access port circuitry.

FIG. 3 schematically illustrates the control registers 226 in more detail. These control registers include a barrier control register 32, a data read/write register 34, a target address register 36 and an operation control register 38. The operation control register 38 may be written with a value that controls the access port node 26 to perform a desired operation, including parameters such as privilege level or domain associated with transactions. The target address register 36 is used to hold an address value which is a target address for a read transaction or a write transaction to be performed via the interconnect circuitry 20. The read/write register 34 is used to hold a data value which is either read from a memory location within the integrated circuit 2 in response to a read transaction or written to a memory location within the integrated circuit 2 in response to a write transaction. The barrier control register 32 is used to trigger the generation of a barrier transaction.

Figure 4:
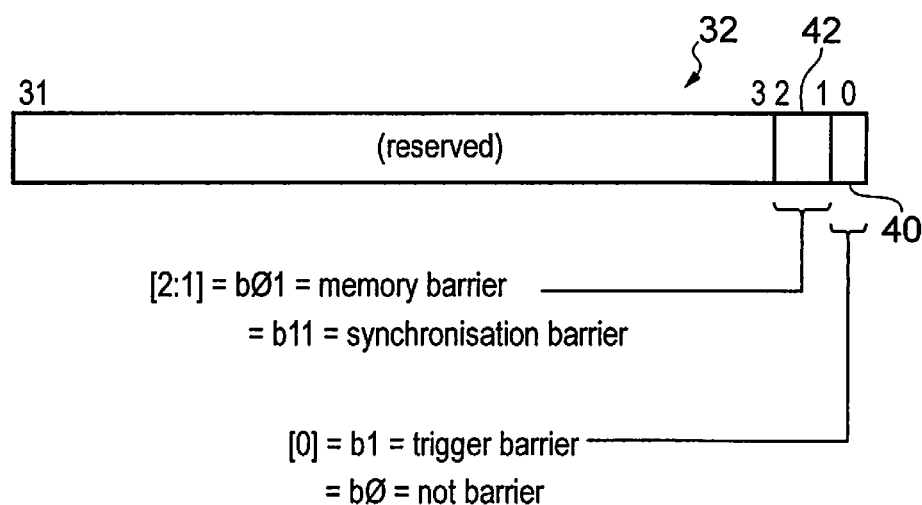
FIG. 4 schematically illustrates a barrier control register.

FIG. 4 schematically illustrates the barrier control register 32 in more detail. The barrier control register 32 includes a first field 40 in which, if a value of "1" is written, then a barrier transaction will be issued via the node 26 to the interconnect circuitry 20. When the barrier transaction has been issued, then the field 40 is reset back to a value of "0" by the node 26 and the interface circuitry 22. If a value of "1" is written to the field 40 while the value held within the field 40 is already "1", then the second write will be ignored as a barrier transaction is already in the process of being issued.

A second field 42 within the barrier control register 32 is written by a debug command to a value which specifies the type of barrier transaction to be issued. If the second field is written with a value "11", then a synchronisation barrier transaction is issued. If the second field 42 is written with a value "01", then a memory barrier transaction is issued. It will be appreciated that the barrier control value written to the barrier control register 32 will typically include both the first field 40 and the second field 42. The most significant bits of the barrier control value are currently reserved in their meaning.

Figure 5:
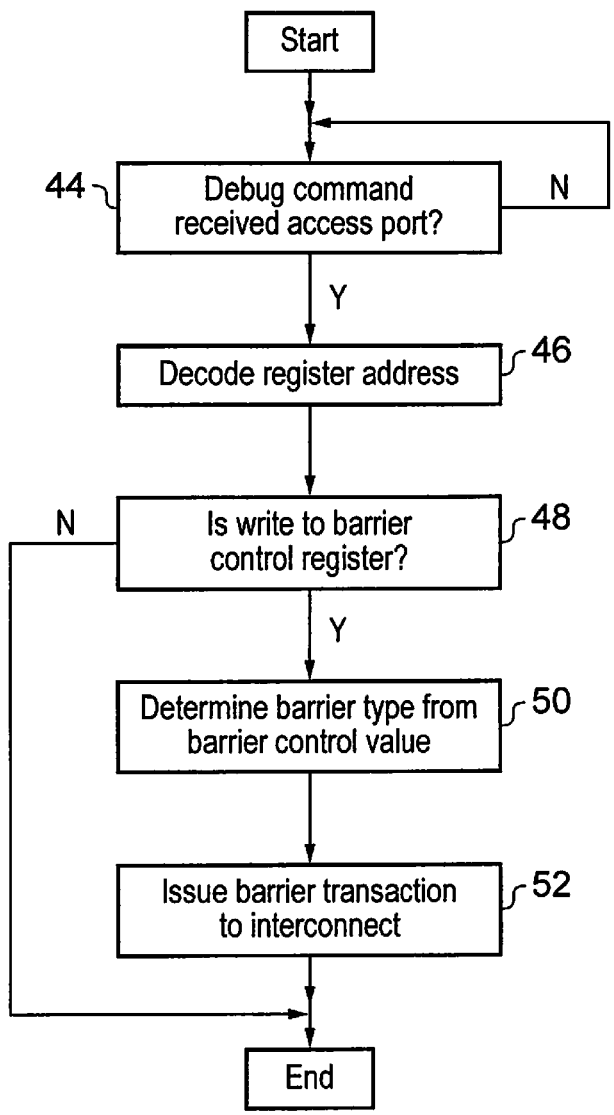
FIG. 5 schematically illustrates triggering of issue of a barrier transaction by the debug access port circuitry.

FIG. 5 schematically illustrates the behaviour of the debug access port circuitry 4 in generating a barrier transaction. At step 44 processing waits until a transaction command is received in the debug access port circuitry 4. When such a command is received, then step 46 serves to decode the register address to which the debug command is directed. This register address specifies one of the access port control registers 226 illustrated in FIG. 3. Step 48 then determines if the debug command received at step 44 is a write to the barrier control register 32. In this example, if there is a write to the barrier control register 32, then this may be assumed to be triggering issue of a barrier transaction without the need to examine the first field 40. However, in other examples it is possible that a read could be made of the first field 40 to determine whether or not it has been sent to a value of "1" as discussed above in relation to FIG. 4.

If the determination at step 48 is that a write has been made to the barrier control register 32, then step 50 serves to determine the barrier type from the second field 42 within the barrier control value. Step 52 then issues the selected type of barrier transaction (either a memory barrier transaction or a synchronisation barrier transaction) to the interconnect circuitry 20 in step 52.

If the determination at step 48 is that there is not a write to the barrier control register, then processing terminates as some other type of debug operation is being instructed and this will be handled by other logic and control mechanisms.

Figure 6:
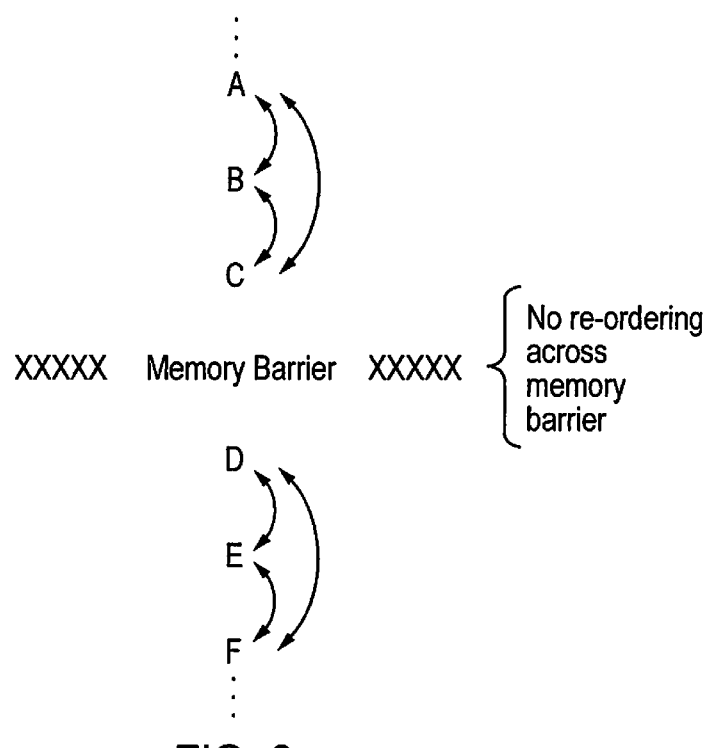
FIG. 6 schematically illustrates the action of a memory barrier transaction.

FIG. 6 schematically illustrates a memory barrier transaction. It will be seen that transactions may be reordered on each side of the memory barrier transaction. However, memory transactions may not be reordered such that they change side of the memory barrier transaction.

Figure 7:
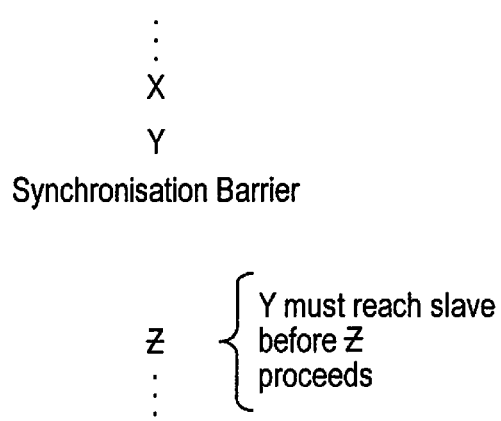
FIG. 7 schematically illustrates the action of a synchronisation barrier transaction.

FIG. 7 schematically illustrates a synchronisation barrier transaction. The interconnect circuitry 20 is responsive to such a synchronisation barrier transaction to delay progress of transaction Y through the interconnect circuitry 20 until the latest preceding transaction Z on the other side of the synchronisation barrier transaction has reached its destination transaction slave.

The domain control field with control register 38 may have values such as:
00 Non-shareable. Order for this master only.
01 Inner domain.
10 Outer domain.
11 System. All masters in the system.

Further details of barrier transactions may be found in published patent application Nos. GB-A-2,474,532 and GB-A-2,474,533. The contents of these published applications are incorporated herein by reference in its entirety and in particular in relation to their discussion of the operation and behaviour of barrier transactions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   one or more transaction masters configured to generate a plurality of data transactions;
   debug access port circuitry configured to be coupled via a debug interface to a debug controller external of said integrated circuit; and
   interconnect circuitry coupled to said one or more transaction masters and said debug access port circuitry and configured to receive a plurality of data transactions from said one or more transaction masters and said debug access port circuitry, wherein
   said debug access port circuitry is configured to respond to one or more debug commands received from said debug controller via said debug interface to generate a barrier transaction; and
   said interconnect circuitry is configured to receive said barrier transaction and to respond to said barrier transaction by constraining a relative ordering between a first subset and a second subset of said plurality of data transactions at least through said interconnect circuitry.

2. An integrated circuit as claimed in claim 1, wherein said barrier transaction is a memory barrier transaction and said interconnect circuitry is configured to provide that at least some actions of all of said transactions of said first subset are observable to each observer, being one of said one or more transaction masters and said debug access port circuitry, before actions of any of said transactions of said second subset are observable to said observer.

3. An integrated circuit as claimed in claim 1, wherein said barrier transaction is a memory barrier transaction and said interconnect circuitry is configured to maintain said relative ordering by not permitting reordering of at least some of said plurality of said data transactions across said memory barrier transaction.

4. An integrated circuit as claimed in claim 1, wherein said barrier transaction is a synchronisation barrier transaction and said interconnect circuitry is configured to provide that at least some actions of all of said transactions of said first subset are observable to all observers, being said one or more transaction masters and said debug access port circuitry, before actions of any of said transactions of said second subset are observable to any of said observers.

5. An integrated circuit as claimed in claim 4, wherein said barrier transaction is a synchronisation barrier transaction and said interconnect circuitry is configured to maintain said relative ordering by delaying said second subset succeeding said synchronisation barrier transaction until said first subset have reached their destination slaves.

6. An integrated circuit as claimed in claim 1, wherein said debug access port circuitry comprises a barrier control register and said debug access port circuitry is configured to respond to a barrier debug command received from said debug controller to write a barrier control value to said barrier control register.

7. An integrated circuit as claimed in claim 6, wherein said debug access port circuitry is configured to respond to writing of said barrier control value to said barrier control register by generating said barrier transaction.

8. An integrated circuit as claimed in claim 6, wherein said barrier control value specifies what type of said barrier transaction is to be generated.

9. An integrated circuit as claimed in claim 1, further comprising a transaction control register specifying parameters for a barrier operation associated with said barrier transaction.

10. An integrated circuit as claimed in claim 9, wherein said parameters include a domain of operation for said barrier transaction.

11. An integrated circuit comprising:
    one or more transaction master means for generating a plurality of data transactions;
    debug access port means for coupling via a debug interface to a debug controller external of said integrated circuit; and
    interconnect means for receiving a plurality of data transactions from said one or more transaction master means and said debug access port means, wherein
    said debug access port means responds to one or more debug commands received from said debug controller via said debug interface to generate a barrier transaction; and
    said interconnect means receives said barrier transaction and responds to said barrier transaction by constraining a relative ordering between a first subset and a second subset of said plurality of data transactions at least through said interconnect circuitry.

12. A method of operating an integrated circuit comprising the steps of:
    generating a plurality of data transactions with one of more transaction masters;
    coupling debug access port circuitry via a debug interface to a debug controller external of said integrated circuit;
    receiving at interconnect circuitry a plurality of data transactions from said one or more transaction masters and said debug access port circuitry,
    responding to one or more debug commands received from said debug controller via said debug interface to generate a barrier transaction issued from said debug access port circuitry to said interconnect circuitry; and
    constraining, in response to said barrier transaction received by said interconnect circuitry, a relative ordering between a first subset and a second subset of said plurality of data transactions at least through said interconnect circuitry.

13. A method as claimed in claim 12, wherein said barrier transaction is a memory barrier transaction and said relative ordering is constrained by providing that at least some actions of all of said transactions of said first subset are observable to each observer, being one of said one or more transaction masters and said debug access port circuitry, before actions of any of said transactions of said second subset are observable to said observer.

14. A method as claimed in claim 13, wherein said barrier transaction is a memory barrier transaction and said relative ordering is constrained to maintain said relative ordering by not permitting reordering of at least some of said plurality of said data transactions across said memory barrier transaction.

15. A method as claimed in claim 12, wherein said barrier transaction is a synchronisation barrier transaction and said relative ordering is constrained by providing that at least some actions of all of said transactions of said first subset are observable to all observers, being said one or more transaction masters and said debug access port circuitry, before actions of any of said transactions of said second subset are observable to any of said observers.

16. A method as claimed in claim 15, wherein said barrier transaction is a synchronisation barrier transaction and said relative ordering is constrained to maintain said relative ordering by delaying said second subset succeeding said synchronisation barrier transaction until said first subset have reached their destination slaves.

17. A method as claimed in claim 12, comprising, in response to a barrier debug command received from said debug controller, writing a barrier control value to a barrier control register within said debug access port circuitry.

18. A method as claimed in claim 17, comprising, response to writing of said barrier control value to said barrier control register, generating said barrier transaction.

19. A method as claimed in claim 17, wherein said barrier control value specifies what type of said barrier transaction is to be generated.

20. A method as claimed in claim 12, comprising storing parameters for a barrier operation associated with said barrier transaction in a transaction control register.

21. A method as claimed in claim 20, wherein said parameters include a domain of operation for said barrier transaction.

* * * * *